(12) United States Patent
Tomomatsu et al.

(10) Patent No.: US 8,569,813 B2
(45) Date of Patent: Oct. 29, 2013

(54) INDUCTIVE LOAD DRIVING CIRCUIT

(75) Inventors: Hiroyuki Tomomatsu, Oita (JP); Tohru Katoh, Tokyo (JP); Motoaki Kusamaki, Ibaraki (JP); Tetsuhiko Kinoshita, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 961 days.

(21) Appl. No.: 11/834,097

(22) Filed: Aug. 6, 2007

(65) Prior Publication Data

US 2008/0099872 A1     May 1, 2008

(30) Foreign Application Priority Data

Oct. 30, 2006  (JP) .................................. 2006-294898

(51) Int. Cl.
*H01L 27/146*     (2006.01)

(52) U.S. Cl.
USPC ........... 257/292; 257/184; 257/258; 257/264; 257/447; 257/E27.148; 257/E31.079

(58) Field of Classification Search
USPC .......... 257/E31.061, E31.058, 292, 184, 258, 257/264, 447, E27.148, E31.079
See application file for complete search history.

(56) References Cited

U.S. PATENT DOCUMENTS

| | | | | |
|---|---|---|---|---|
| 4,377,817 A | * | 3/1983 | Nishizawa et al. | ........... 257/258 |
| 5,214,276 A | * | 5/1993 | Himoto et al. | ............. 250/214.1 |
| 5,764,826 A | * | 6/1998 | Kuhara et al. | ................... 385/24 |
| 6,043,550 A | * | 3/2000 | Kuhara et al. | .................. 257/461 |
| 2004/0033666 A1 | * | 2/2004 | Williams et al. | ............... 438/297 |
| 2005/0014329 A1 | * | 1/2005 | Williams et al. | ............... 438/218 |

* cited by examiner

*Primary Examiner* — Zandra Smith
*Assistant Examiner* — Tsz Chiu
(74) *Attorney, Agent, or Firm* — John R. Pessetto; W. James Brady; Frederick J. Telecky, Jr.

(57) ABSTRACT

The objective of this invention is to provide a photodiode which has high sensitivity even to light with a wavelength in the blue region while maintaining the high-frequency characterstics. The n type second semiconductor layer (13) containing an n type electroconductive impurity at a low concentration is formed directly or via an intrinsic semiconductor layer (11) on the p type first semiconductor layer (10). The third semiconductor layer (20) containing an n type electroconductive impurity at a medium concentration is formed shallower than said second semiconductor layer (13) in its main plane. The fourth semiconductor layer (21) containing an n type electroconductive impurity at a high concentration is formed shallower than said third semiconductor layer (20) in the main plane of the third semiconductor layer (20). The metal-containing electroconductive layer (22) is formed on said fourth semiconductor layer (21) in the same layout as the fourth semiconductor layer (21), with the third semiconductor layer (20) and the fourth semiconductor layer (21) being separated by the second semiconductor layer (13) in at least one cross section.

16 Claims, 10 Drawing Sheets

INDUCTIVE LOAD DRIVING CIRCUIT

FIELD OF THE INVENTION

The present invention pertains to a photodiode used as photoelectric converting element.

BACKGROUND OF THE INVENTION

In a semiconductor device, a photodiode can convert received light into a current. It is widely used as light receiving element for optical pickup devices incorporated in CD players, DVD players, or other optical disc devices. The photodiode is constituted with a pn junction semiconductor. The depletion layer is widened by applying an inverse bias to the pn junction to form a strong electric field. Electron-hole pairs are generated by the light mainly absorbed in the depletion layer. Attraction by the electric field causes the electrons to move toward the n type semiconductor region, while holes move toward the p type semiconductor region, and a current can be detected.

Among the types of said photodiode, there are PIN photodiodes, which have an I layer (p− layer or n− layer) containing an electroconductive impurity at a low concentration between the p layer and the n layer and in which the depletion layer can easily widen at a low voltage, and avalanche photodiodes, which have a region where avalanche collapse occurs.

Silicon can only perform photoelectric conversion of light with a wavelength in the range of 400-1100 nm. Since the energy of light with a wavelength longer than 1100 is lower than the energy gap (1.12 V) of silicon, no electron-hole pair can be formed. Also, light with a wavelength shorter than 400 nm can only generate electron-hole pairs near the surface of silicon. Since the electron-hole re-coupling rate near the surface of silicon is usually very high, the generated electron-hole pairs will become re-coupled very quickly and disappear before photocarriers are detected.

Currently, for example, light with a wavelength of 780 nm or of 650 nm is used as the light source incorporated into optical pickups of optical disc devices. Such light, however, can only reach a depth of about 20-40 μm from the silicon surface. On the other hand, the use of light with a wavelength of 405 nm in optical pickups for optical disc devices has been studied for practical applications realizing high-density recording. Light in this region can only reach a depth of about 0.6 μm from the silicon surface.

Consequently, for a photodiode for receiving light with a wavelength of 780 nm or light in the red region with a wavelength of 650 nm, the sensitivity, CR time constant, and other high-frequency characteristics can be improved by forming the depletion layer in the region at a depth of 20-40 μm from the surface of silicon and by increasing the impurity concentration in the p region and n region that constitute the pn junction to reduce the resistance.

However, in order to receive light with a wavelength in the blue region of 405 nm, for example, it is necessary to form the depletion layer in the region near the surface layer at a depth of about 0.6 μm from the silicon surface. The structure of the conventional photodiode makes it difficult to for a depletion layer near the surface since the high-concentration impurity region is present near the silicon surface layer. Also, if the concentration of the electroconductive impurity present near the surface is reduced to from the depletion layer, the CR time constant will be increased. As a result, the response speed is lowered, and the high-frequency characteristics deteriorate.

Patent Reference 1 discloses a photodiode with improved sensitivity caused by reducing re-coupling near the silicon surface by forming a semiconductor layer of a second electroconductivity type so that there is a part subdivided by a semiconductor layer of a first electroconductivity type in at least one cross section in the surface layer part of the semiconductor layer of the first electroconductivity type.

Patent Reference 1: Japanese Kokai Patent Application No. 2001-320075.

In the photodiode disclosed in said Patent Reference 1, since the semiconductor layer of the second electroconductivity type is subdivided by the semiconductor layer of the first electroconductivity type, deterioration of the high-frequency characteristics becomes inevitable.

The purpose of the present invention is to solve the aforementioned problem by providing a photodiode that exhibits high sensitivity even to light with a wavelength in the blue region while maintaining its high-frequency characteristics.

SUMMARY OF THE INVENTION

In order to realize the aforementioned purpose the present invention provides a photodiode having a p type first semiconductor layer, an n type second semiconductor layer formed directly or via an intrinsic semiconductor layer on said first semiconductor layer and containing an n type electroconductive impurity at a low concentration, an n type third semiconductor layer that contains an n type electroconductive impurity at a medium concentration and is formed shallower than said second semiconductor layer in the main plane of the second semiconductor layer in a layout subdivided by said second semiconductor layer in at least one cross section, an n type fourth semiconductor layer that contains an n type electroconductive impurity at a high concentration and is formed shallower than said third semiconductor layer in the main plane of the third semiconductor layer in a layout subdivided by said second semiconductor layer in at least one cross section, and a metal-containing electroconductive layer formed on said fourth semiconductor layer in the same layout as the fourth semiconductor layer.

For the photodiode of the present invention, the n type second semiconductor layer containing an n type electroconductive impurity at a low concentration is formed directly or via an intrinsic semiconductor layer on the p type first semiconductor layer. The n type third semiconductor layer containing an n type electroconductive impurity at a medium concentration is formed shallower than said second semiconductor layer in the main plane of the second semiconductor layer in a layout subdivided by said second semiconductor layer in at least one cross section. The n type fourth semiconductor layer containing an n type electroconductive impurity at a high concentration is formed shallower than said third semiconductor layer in the main plane of the third semiconductor layer in a layout subdivided by said second semiconductor layer in at least one cross section. The metal-containing electroconductive layer is formed on said fourth semiconductor layer in the same layout as the fourth semiconductor layer.

In the aforementioned photodiode of the present invention, when a prescribed voltage is applied to said first semiconductor layer and second semiconductor layer, a depletion layer is preferably formed in the area near the main plane of the second semiconductor layer in the region where said fourth semiconductor layer is subdivided.

Also, in order to realize the aforementioned purpose, the present invention provides a photodiode having a p type first semiconductor layer, an n type second semiconductor layer formed directly or via an intrinsic semiconductor layer on said first semiconductor layer and containing an n type electroconductive impurity at a low concentration, an n type third semiconductor layer that contains an n type electroconductive impurity at a medium concentration and is formed shallower than said second semiconductor layer in the main plane of the second semiconductor layer, an n type fourth semiconductor layer that contains an n type electroconductive impurity at a high concentration and is formed shallower than said third semiconductor layer in the main plane of the third semiconductor layer in a layout subdivided by said third semiconductor layer in at least one cross section, and a metal-containing electroconductive layer formed on said fourth semiconductor layer in the same layout as the fourth semiconductor layer.

In said photodiode of the present invention, the n type second semiconductor layer containing an n type electroconductive impurity at a low concentration is formed directly or via an intrinsic semiconductor layer on said p type first semiconductor layer. The n type third semiconductor layer containing an n type electroconductive impurity at a medium concentration is formed shallower than said second semiconductor layer in the main plane of the second semiconductor layer. The n type fourth semiconductor layer containing an n type electroconductive impurity at a high concentration is formed shallower than said third semiconductor layer in the main plane of the third semiconductor layer in a layout subdivided by said third semiconductor layer in at least one cross section. The metal-containing electroconductive layer is fanned on said fourth semiconductor layer in the same layout as the fourth semiconductor layer.

In said photodiode of the present invention, preferably, when a prescribed voltage is applied to said first semiconductor layer and second semiconductor layer, a depletion layer is formed in the area near the main plane of the third semiconductor layer in the region where said fourth semiconductor layer is subdivided.

Also, for said photodiode of the present invention, said metal-containing electroconductive layer is preferably a metal silicide layer.

In addition, the layout of said fourth semiconductor layer and the metal-containing electroconductive layer is preferably a lattice-shaped pattern or a pattern of plural straight lines.

Also, in order to realize the aforementioned purpose, the present invention provides a photodiode having a first semiconductor layer of a first electroconductivity type, a second semiconductor layer of a second electroconductivity type formed on said first semiconductor layer, a third semiconductor layer of the second electroconductivity type and having a higher impurity concentration than said second semiconductor layer that is formed partially in the main plane of said second semiconductor layer, a metal silicide layer formed on said third semiconductor layer, and a first electrode electrically connected to said metal silicide layer and said third semiconductor layer.

For said photodiode of the present invention, the second semiconductor layer of the second electroconductivity type is formed on the first semiconductor layer of the first electroconductivity type. The third semiconductor layer of the second electroconductivity type having a higher impurity concentration than the second semiconductor layer is formed in part of the main plane of the second semiconductor layer. A metal silicide layer is formed on the third semiconductor layer. A first electrode is formed that is electrically connected to the metal silicide layer and the third semiconductor layer.

DESCRIPTION OF THE EMBODIMENTS

In the photodiode of the present invention, the second semiconductor layer with a low concentration, the third semiconductor layer with a medium concentration, and the fourth semiconductor layer with a high concentration are laminated to for the n type semiconductor layer that constitutes the pn junction. The fourth semiconductor layer and the third semiconductor layer are subdivided by the second semiconductor layer in one cross section. Alternatively, the fourth semiconductor layer is subdivided by the third semiconductor layer in one cross section. Consequently, when a prescribed voltage is applied to the first and second semiconductor layers, the depletion layer can be widened into the area near the surface layer of the n type second or third semiconductor layer that subdivides the fourth semiconductor layer. As a result, the sensitivity to light with a wavelength in the blue region can also be improved.

Also, since the n type fourth electroconductive layer is subdivided by the n type second or third semiconductor layer, an increase is the electrical resistance of the n type layer can be controlled. In this way, deterioration of the high-frequency characteristics can be alleviated so that the sensitivity to light with a wavelength in the blue region can be improved while maintaining the essential high-frequency characteristics.

In the following, the embodiments of the photodiode disclosed in the present invention will be explained based on figures.

Embodiment 1

Figure 1:
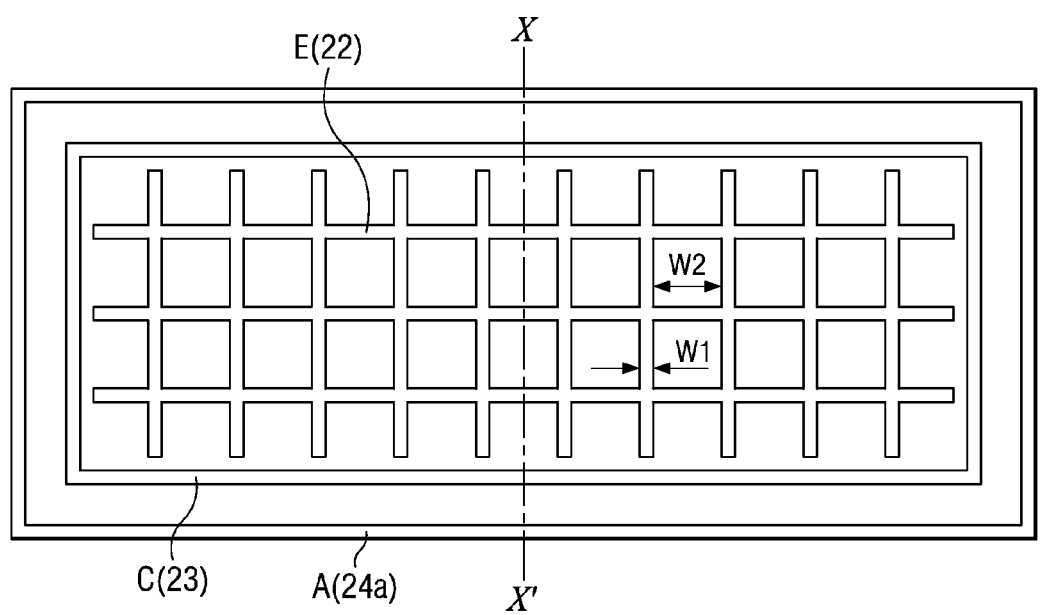
FIG. 1 is a plan view illustrating the layout of the photodiode disclosed in the first embodiment of the present invention.
Figure 2:
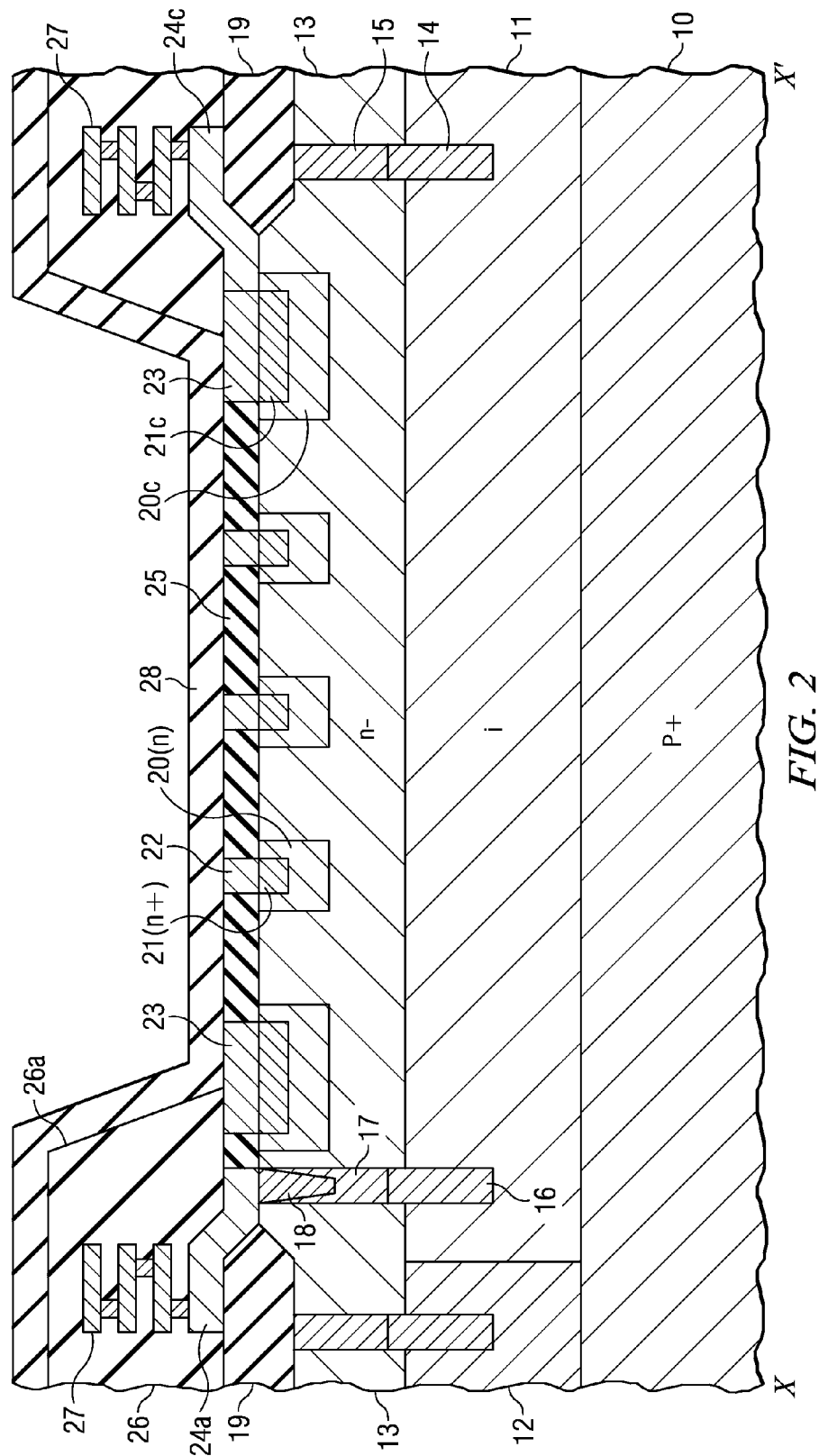
FIG. 2 is a cross section along X-X' in FIG. 1.

FIG. 1 is a plan view illustrating the layout of the photodiode disclosed in the present invention. FIG. 2 is a cross section along X-X' in FIG. 1.

For example, intrinsic semiconductor layer 11 is formed in the photodiode region on semiconductor substrate (first semiconductor layer) 10 containing a p type electroconductive impurity at a high concentration. Also, a p+ type semiconductor layer 12 containing a p type impurity at a high concentration is formed in the same thickness as intrinsic semiconductor layer 11 in the element separating region. The resistivity of semiconductor substrate 10 is 0.01-0.02 Ω·cm. Intrinsic layer 11 is formed, for example, using the epitaxial growth method. Its resistivity is in the range of about 1000-4000 Ω·cm, and its thickness is in the range of about 22.5-27.5 μm.

Also, for example, n− type semiconductor layer (second semiconductor layer) 13 containing an n type electroconductive impurity at a low concentration is formed on intrinsic semiconductor later 11 and p+ type semiconductor layer 12. N− type semiconductor layer 13 contains P or another n type impurity, and has a resistivity of about 2-4 Ω·cm. It is formed at a thickness of about 800-1000 nm.

Also, for example, p+ type semiconductor layer 14 and p+ semiconductor layer 15 are formed through n⁻ type semiconductor layer 13 in the element separating region. An element separating film 19 is formed by means of LOCOS (local oxidation of silicon) on said semiconductor layer to separate the elements. Also, p+ type semiconductor layer 16, p+ type semiconductor layer 17, and p+ type semiconductor layer 18 used for applying the cathode voltage to intrinsic semiconductor layer 11 are formed through n⁻ type semiconductor layer 13 to intrinsic semiconductor layer 11.

For example, an n type semiconductor layer (third semiconductor layer) 20 containing an n type impurity at a medium concentration is formed shallower than n⁻ type semiconductor layer 13 in the main plane of n⁻ semiconductor layer 13 in a layout subdivided by n⁻ semiconductor layer 13 in the X-X' cross section, for example. N type semiconductor layer 20 contains P or another n type impurity and has a resistivity in the range of about 0.02-2 Ω·cm. It is formed from the surface of n− semiconductor layer 13 to a depth of about 500 nm.

In addition, for example, an n+ type semiconductor layer (fourth semiconductor layer) 21 containing an n type impurity at a high concentration is formed shallower than n type semiconductor layer 20 in the main plane of n type semiconductor layer 20 in a layout subdivided by n⁻ type semiconductor layer 13 in the X-X' cross section. The n+ type semiconductor layer contains As or another n type impurity and has a resistivity of about 0.02-0.3 Ω·cm. It is formed from the surface of n⁻ type semiconductor layer 13 to a depth of about 300 nm.

Also, for example, n type semiconductor layer 20c and n+ type semiconductor layer 21c used for applying the anode voltage and having the same impurity concentration and depth as n type semiconductor layer 20 and n+ type semiconductor layer 21 are formed in the main plane of n type semiconductor layer 20 in a pattern that surrounds the outer periphery of the light receiving region.

Also, for example, a metal silicide layer 22(E) of PtSi, etc. is formed in the same layout as n+ type semiconductor layer 21 on n+ type semiconductor layer 21. If PtSi is used, the resistivity is about 28-35 μΩ·cm, and the thickness is about 50, nm.

Also, for example, a metal silicide layer 23 made of PtSi, etc., is formed, in the same layout as n+ type semiconductor layer 21c, on n+ type semiconductor layer 21c in a pattern that surrounds the outer periphery of the light receiving region. In this way, cathode electrode C is formed. An electroconductive layer 24c can be formed in an appropriate pattern so that it is connected to cathode electrode C (metal silicide layer 23).

On the other hand, for example, electroconductive layer 24a is formed in an appropriate pattern so that it is connected to p+ type semiconductor layer 18 on the outer periphery of said cathode electrode C. In this way, anode electrode A is formed.

In this case, the pattern for separating said n type semiconductor layer (third semiconductor layer) 20 and n+ type semiconductor layer (fourth semiconductor layer) 21 by n⁻ type semiconductor layer (second semiconductor layer) 13 and the pattern formed by metal silicide layer 22 (E) formed on n+ type semiconductor layer (fourth semiconductor layer) 21 can be a lattice-shaped pattern as shown in FIG. 1.

Also, a first antireflection film 25 with a thickness of about 34.5-39.5 nm made of silicon nitride can be formed to cover the light receiving region using the depressurized CVD (chemical vapor deposition) method. Metal silicide layer 22 is formed by patternizing the first antireflection film 25.

Also, plural silicon oxide layers can be laminated onto the entire surface to form insulating film 26 to cover the light receiving region. An opening 26a is formed in the insulating film 26 to expose the light receiving region.

Plural layers of wiring can be embedded in insulating film 26 and laminated via contacts to form upper wiring 27 connected to electroconductive layer 24c and electroconductive layer 24a.

Also, a second antireflection film 28 about 210-250 nm thick made of silicon nitride an be formed over the entire surface to cover the first antireflection film 25 in said opening 26a by using the plasma CVD method. The antireflection film is comprised of the first antireflection film 25 and the second antireflection film 28.

As described above, a semiconductor device is obtained having the photodiode disclosed in the present invention.

As shown in FIG. 1, width W1 of metal silicide layer 22 (E) is, for example, about 2 μm. Width W2 between metal silicide layers 22 (E) formed parallel with each other is, for example about 50 μm. Also, in FIG. 1 metal silicide layer 22 is not directly connected to cathode electrode C. Instead, it is electrically connected via the n type semiconductor layer positioned below. However, it is also possible to directly connect metal silicide layer 22 to cathode electrode C.

Figure 3:
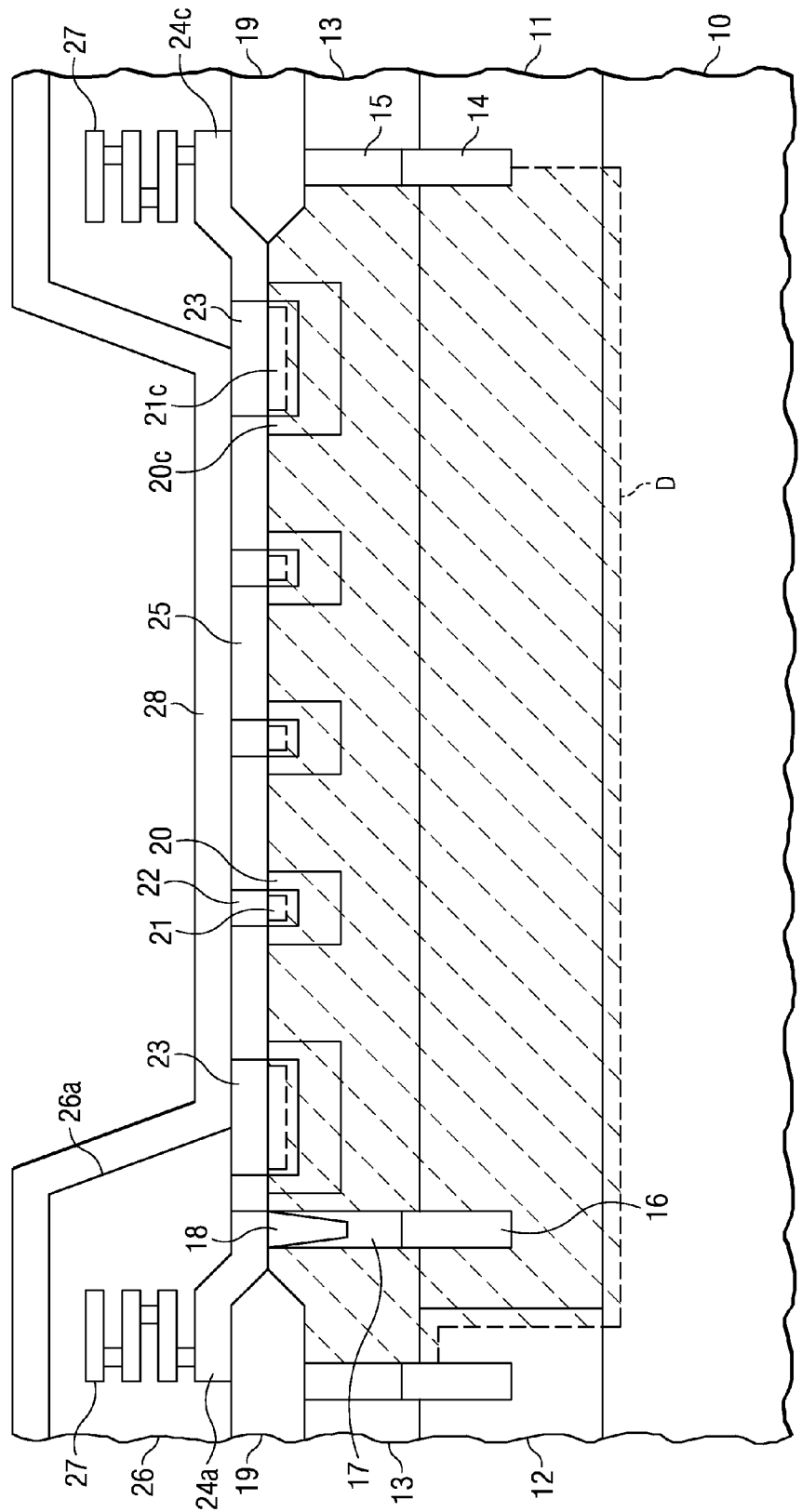
FIG. 3 is a schematic diagram illustrating the widening of the depletion layer when a prescribed voltage is applied from the anode and cathode to the photodiode disclosed in the first embodiment.

FIG. 3 is a schematic diagram illustrating widening of depletion layer D when a prescribed voltage is applied from the anode and cathode to the photodiode disclosed in this embodiment.

As shown in FIG. 3, n⁻ type semiconductor layer (second semiconductor layer) 13 with a low concentration, n type semiconductor layer (third semiconductor layer) 20 with a medium concentration, and n+ type semiconductor layer (fourth semiconductor layer) 21 with high concentration are laminated to form the n type semiconductor layer that forms the pn junction. N+ type semiconductor layer (fourth semiconductor layer) 21 and n type semiconductor layer (third semiconductor layer) 20 are subdivided by n⁻ type semiconductor layer (second semiconductor layer) 13. When a prescribed voltage is applied to semiconductor substrate (first semiconductor layer) 10 and n⁻ type semiconductor layer (second semiconductor layer) 13, the depletion layer can be widened into the area near the surface layer of n⁻ type semiconductor layer (second semiconductor layer) 13 that subdivides n+ type semiconductor layer, (fourth semiconductor layer) 21 and n type semiconductor layer (third semiconductor layer) 20. The sensitivity to light with a wavelength in the blue region can be improved.

In the photodiode disclosed in this embodiment, when electron-hole pairs are generated by the photoelectric effect, the electrons with higher mobility than the holes move fast in the n type semiconductor layer and are captured quickly by metal silicide layer 22(E) from n+ type semiconductor layer 21. As a result, quick re-coupling of the electron-hole pairs can be prevented and controlled, and the detected photocarrier component can be increased. As a result, the sensitivity can be improved.

Also, when n+ type semiconductor layer (fourth semiconductor layer) 21 and n type semiconductor layer (third semiconductor layer) 20 are subdivided by n⁻ type semiconductor layer (second semiconductor layer) 13 in one cross section to adjust the impurity profile of the n type semiconductor layer, an increase in the electrical resistance of the n type layer can be inhibited, and deterioration of the high-frequency characteristics can be controlled so that the sensitivity to light with a wavelength in the blue region can be improved while guaranteeing the essential high-frequency characteristics.

In the following, the method of manufacturing a semiconductor device having the photodiode disclosed in this embodiment will be explained based on FIGS. 4-5.

Figure 4A:
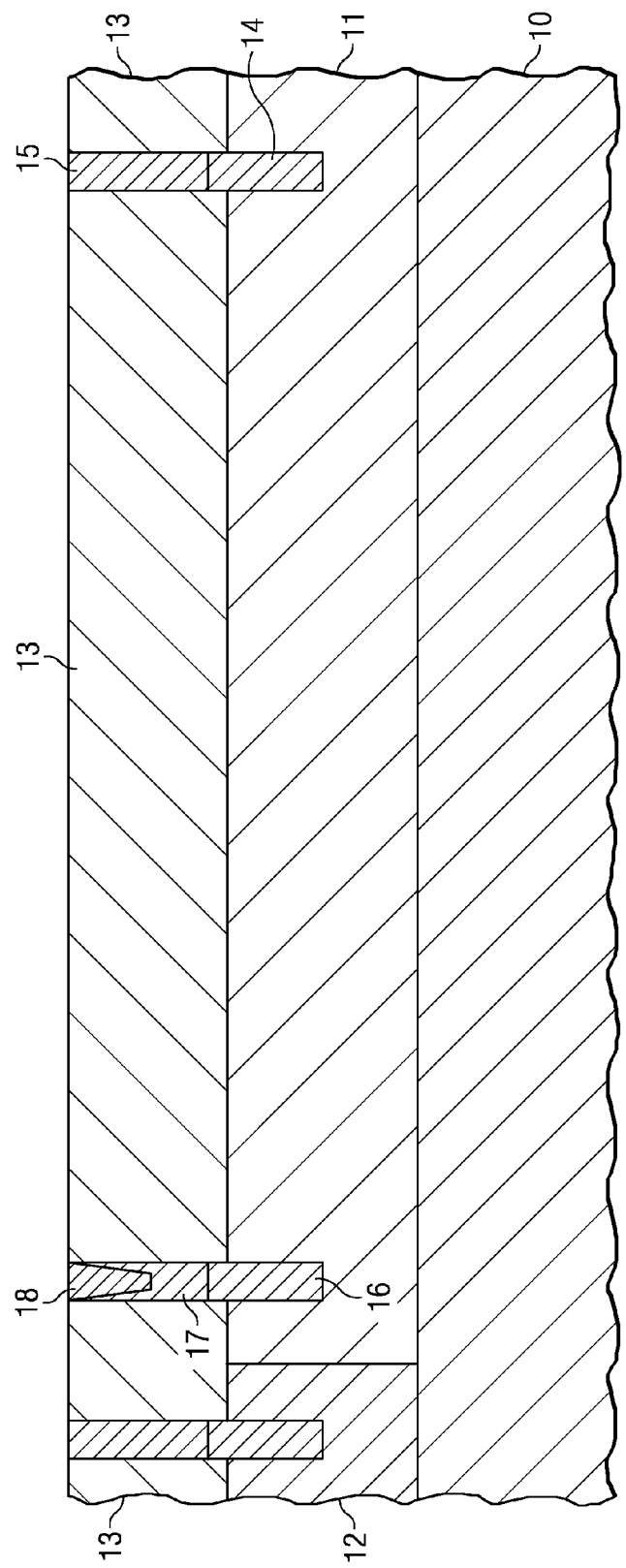
FIGS. 4(A) and 4(B) are cross sections illustrating the process of manufacturing a semiconductor device having the photodiode disclosed in the first embodiment of the present invention.

First, as shown in FIG. 4(A), for example, intrinsic semiconductor layer 11 is formed on p type semiconductor substrate (first semiconductor layer) 10 using the epitaxial growth method. A p type impurity is introduced into the area outside the photodiode to form p+ type semiconductor layer 12. Also, n⁻ type semiconductor layer (second semiconductor layer) 13 containing P, etc., at a low concentration is formed on intrinsic semiconductor layer 11 and p+ semiconductor layer 12.

In this case, a p type impurity is introduced into the boundary between intrinsic semiconductor layer 11, p+ type semiconductor layer 12 and n⁻ type semiconductor layer 13 in advance during the epitaxial growth process, followed by introducing a p type impurity from the top of n⁻ type semiconductor layer 13 to form p+ type semiconductor layers (14, 15, 16, 17, 18).

Figure 4B:
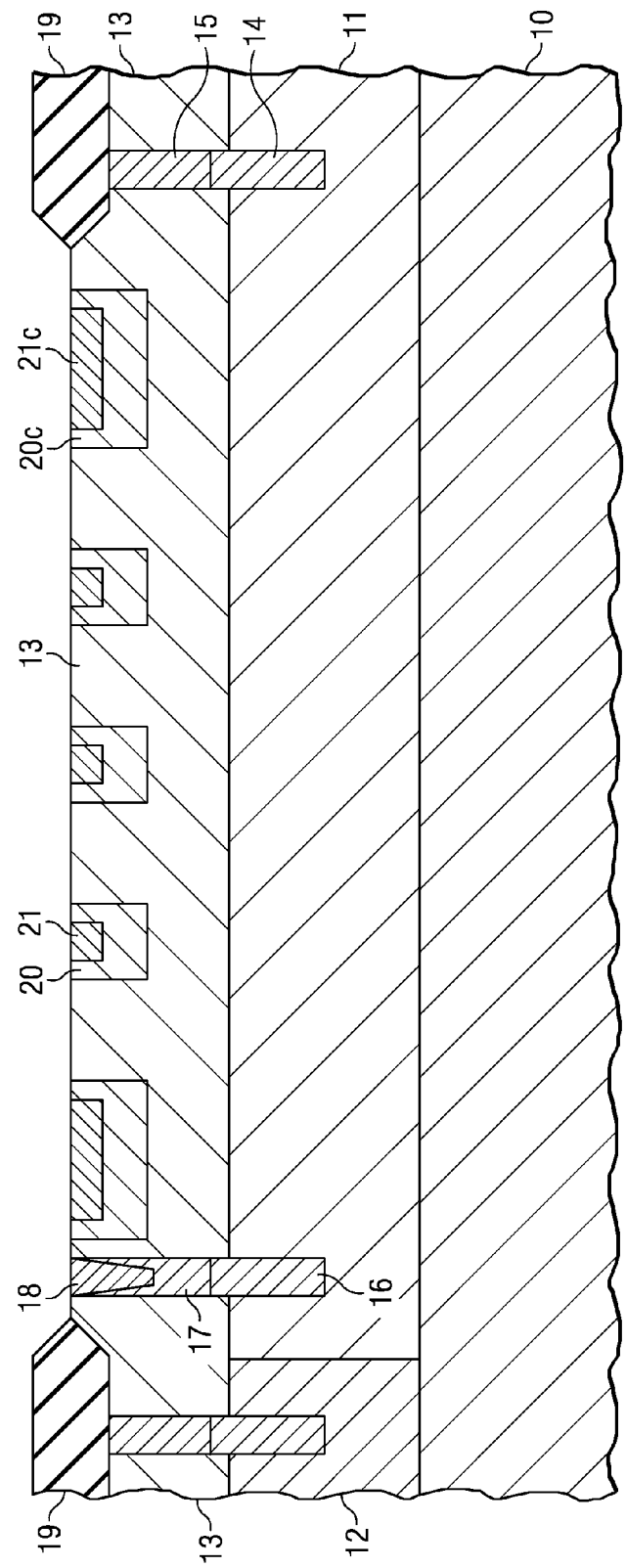

Then, as shown in FIG. 4(B), element separating insulating film 19 is formed by means of LOCOS.

A resist film is then formed in a pattern by means of photolithography, followed b injection of ions of P or another n type impurity to form n type semiconductor layer (third semiconductor layer) 20 containing the n type impurity at a medium concentration. Heat treatment is then performed to diffuse these ions.

After that, a resist film is again formed in a pattern, followed by injection of ions of As or another n type impurity to form n+ type semiconductor layer (fourth semiconductor layer) 21 containing the n type impurity at a high concentration.

Figure 5A:
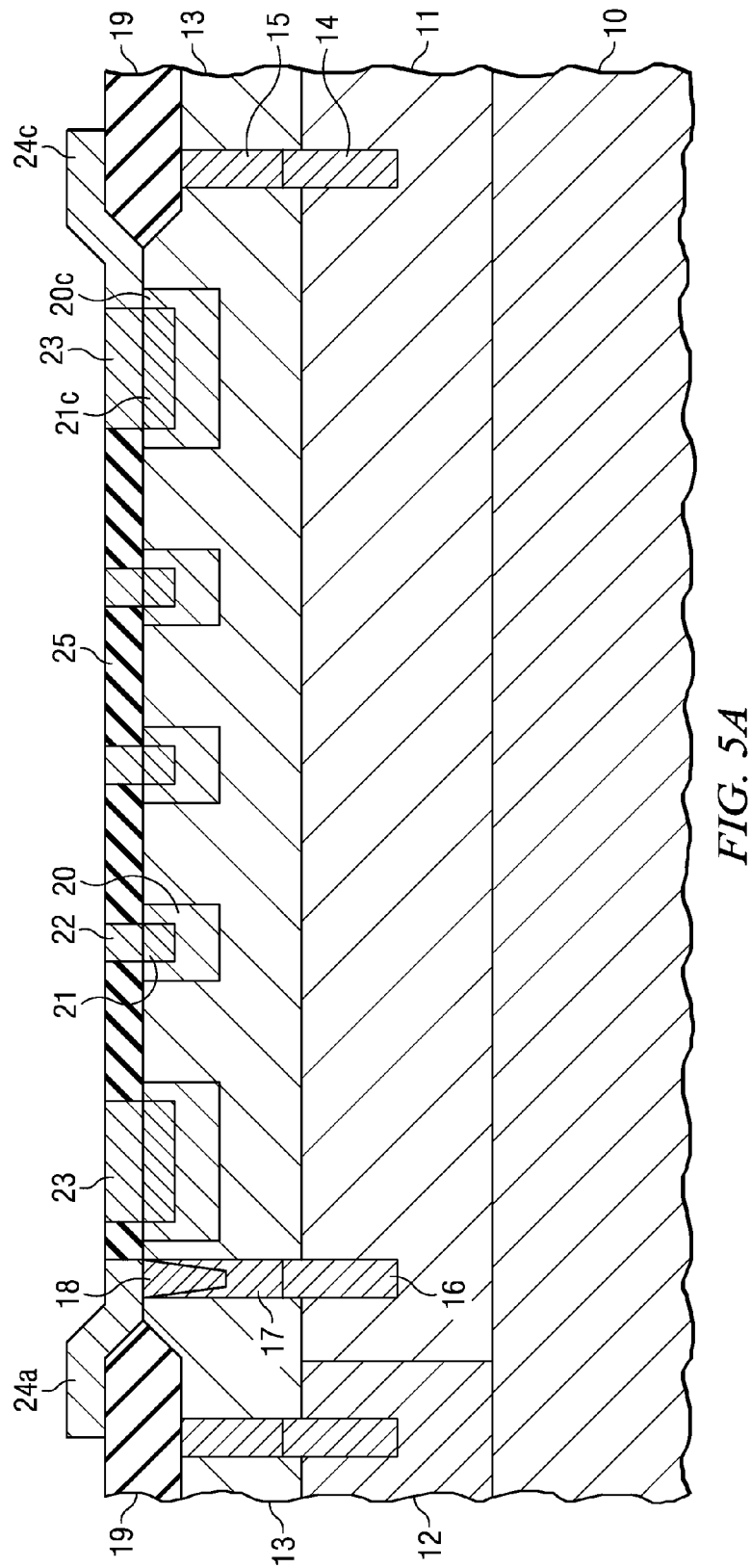
FIGS. 5(A) and 5(B) are cross sections illustrating the process of manufacturing a semiconductor device having the photodiode disclosed in the first embodiment of the present invention.

Then, as shown in FIG. 5(A), a first antireflection film 25 made of silicon nitride and also serving as a silicide blocking layer is formed in a pattern. Pt is deposited by means of sputtering, followed by a heat treatment to form metal silicide layer 22 (E) made of PtSi obtained by siliciding the Pt having contact with silicon. Unreacted Pt is then removed.

Also, electroconductive layers 24a, 24c are formed in a pattern.

Figure 5B:
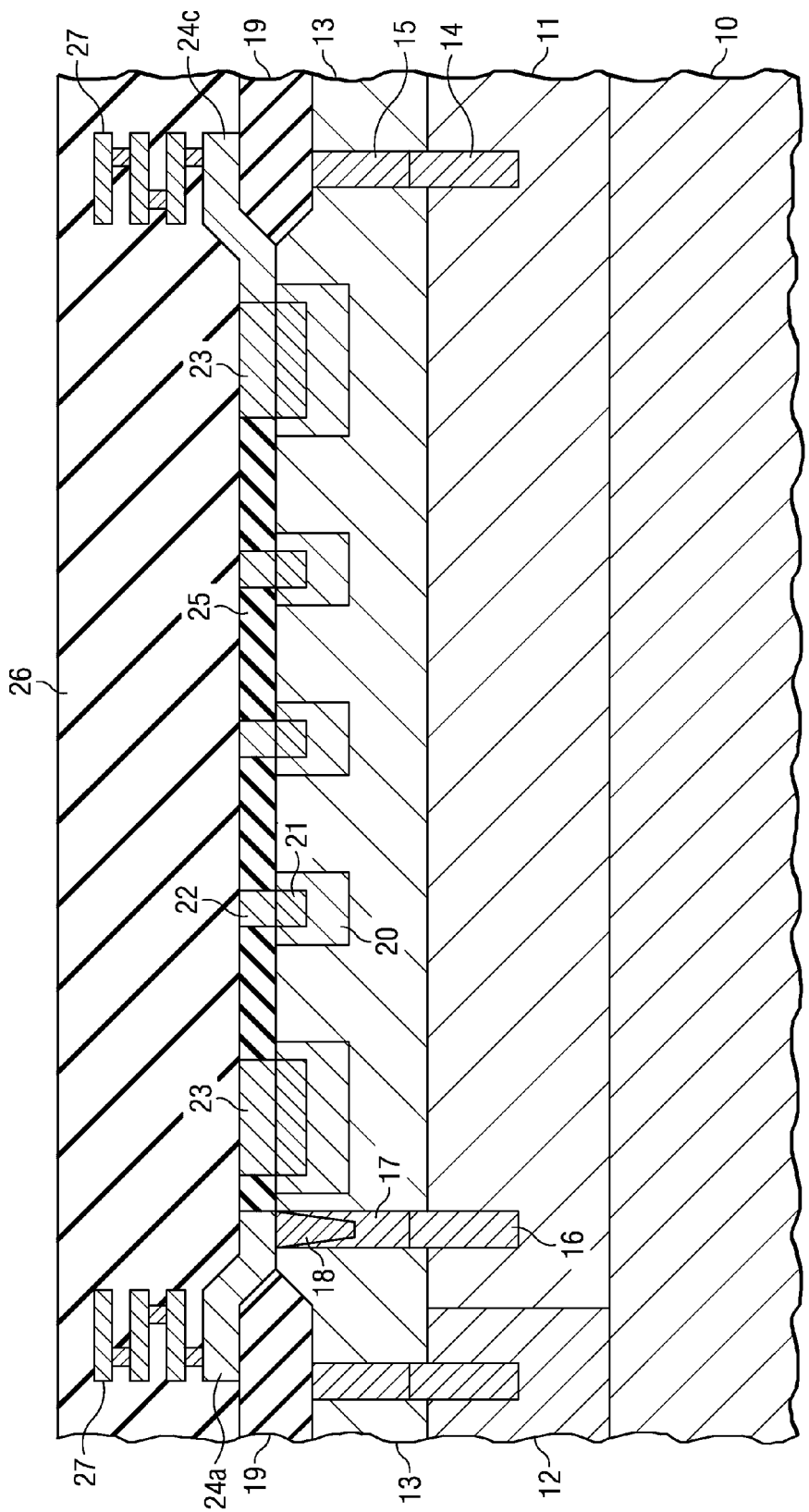

Then, as shown in FIG. 5(B), deposition of silicon oxide using the CVD method, etc., and formation of contacts and wiring outside of the light receiving region are repeated alternately to form insulating film 26 and upper wiring connected to electroconductive layers 24c and 24a and embedded in insulating film 26.

Then, opening 26a that exposes the light receiving region is formed in insulating film 26. After that, silicon nitride is deposited over the entire surface using the plasma CVD method to cover opening 26a to form the second antireflection film 28.

A semiconductor device having the photodiode disclosed in this embodiment can be manufactured in this way.

Figure 6A:
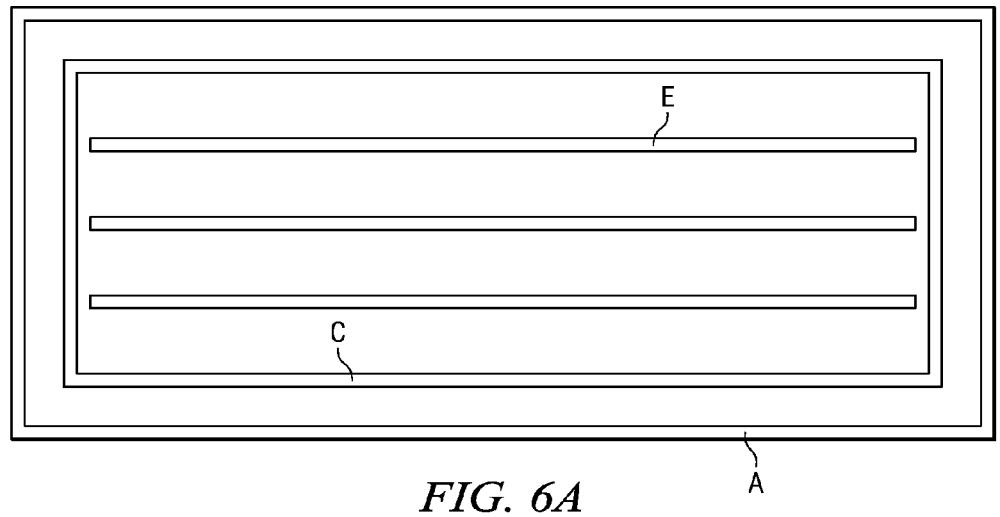
FIGS. 6(A) and 6(B) are plan views illustrating the layout of a modification example of the photodiode in the semiconductor device disclosed in the first embodiment of the present invention.
Figure 6B:
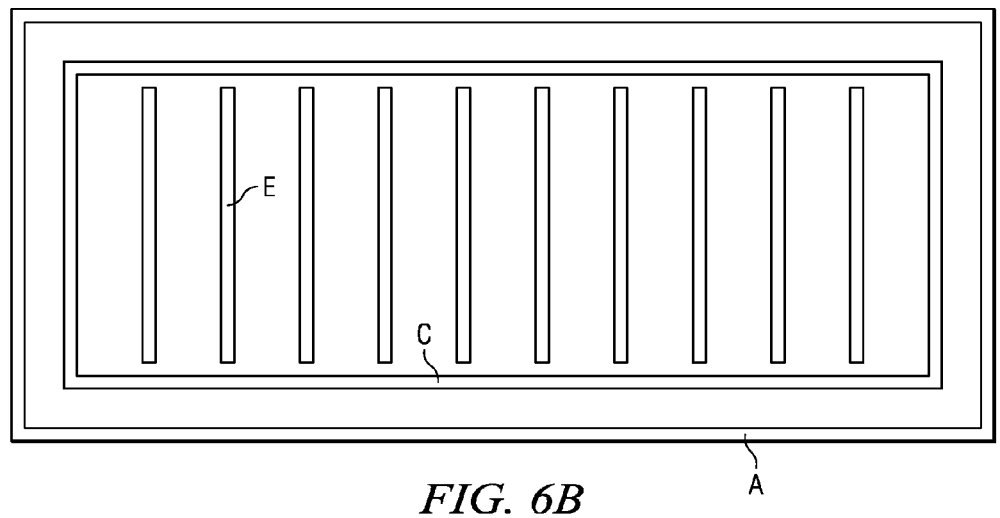

FIGS. 6(A) and 6(B) are plan views illustrating the layout of a modification example of the photodiode disclosed in this embodiment.

Besides the lattice-shaped pattern shown in FIG. 1, the pattern for separating said n type semiconductor layer (third semiconductor layer) 20 and n+ type semiconductor layer (fourth semiconductor layer) 21 by n⁻ type semiconductor layer (second semiconductor layer) 13 and the pattern formed by metal silicide layer 22 (E) formed on n+ type semiconductor layer (fourth semiconductor layer) 21 can also be a pattern of plural straight lines as shown in FIGS. 6(A) and 6(B).

In the explanation made above, metal silicide layer 22 (E) is formed separated from cathode electrode C. It, however, can also be connected at several places.

Embodiment 2

Figure 7:
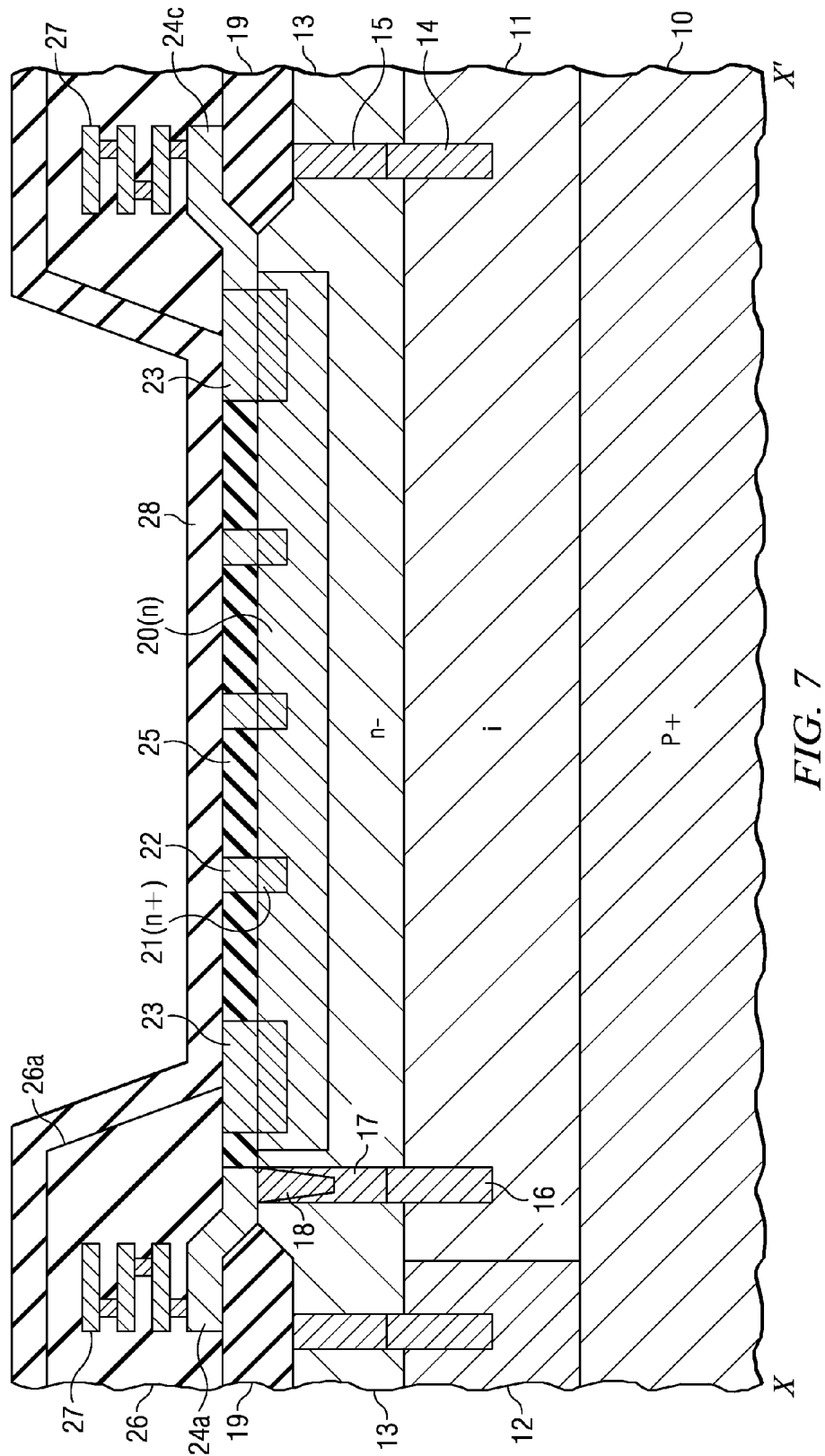
FIG. 7 is a cross section of the photodiode disclosed in the second embodiment of the present invention.

FIG. 7 is a cross section of the photodiode disclosed in this embodiment.

In the first embodiment, n type semiconductor layer (third semiconductor layer) 20 and n+ semiconductor layer (fourth semiconductor layer) 21 are formed in a pattern, subdivided by
n⁻ type semiconductor layer (second semiconductor layer) 13 at least in one cross section. In this embodiment, however, n type semiconductor layer 20 containing an type electroconductive impurity at a medium concentration is formed shallower than n⁻ type semiconductor layer 13 without being subdivided in the main plane of n⁻ type semiconductor layer 13. N+ type semiconductor layer 21 is formed in a pattern subdivided by n type semiconductor layer 20 at least in one cross section.

The impurity concentrations in semiconductor substrate (first semiconductor layer) 10,
n⁻ type semiconductor layer 13, n type semiconductor layer 20, and n+ type semiconductor layer 21 can be set in the same way as in the first embodiment.

Apart from the aforementioned difference, the rest of the configuration is virtually the same as that of the first embodiment.

Figure 8:
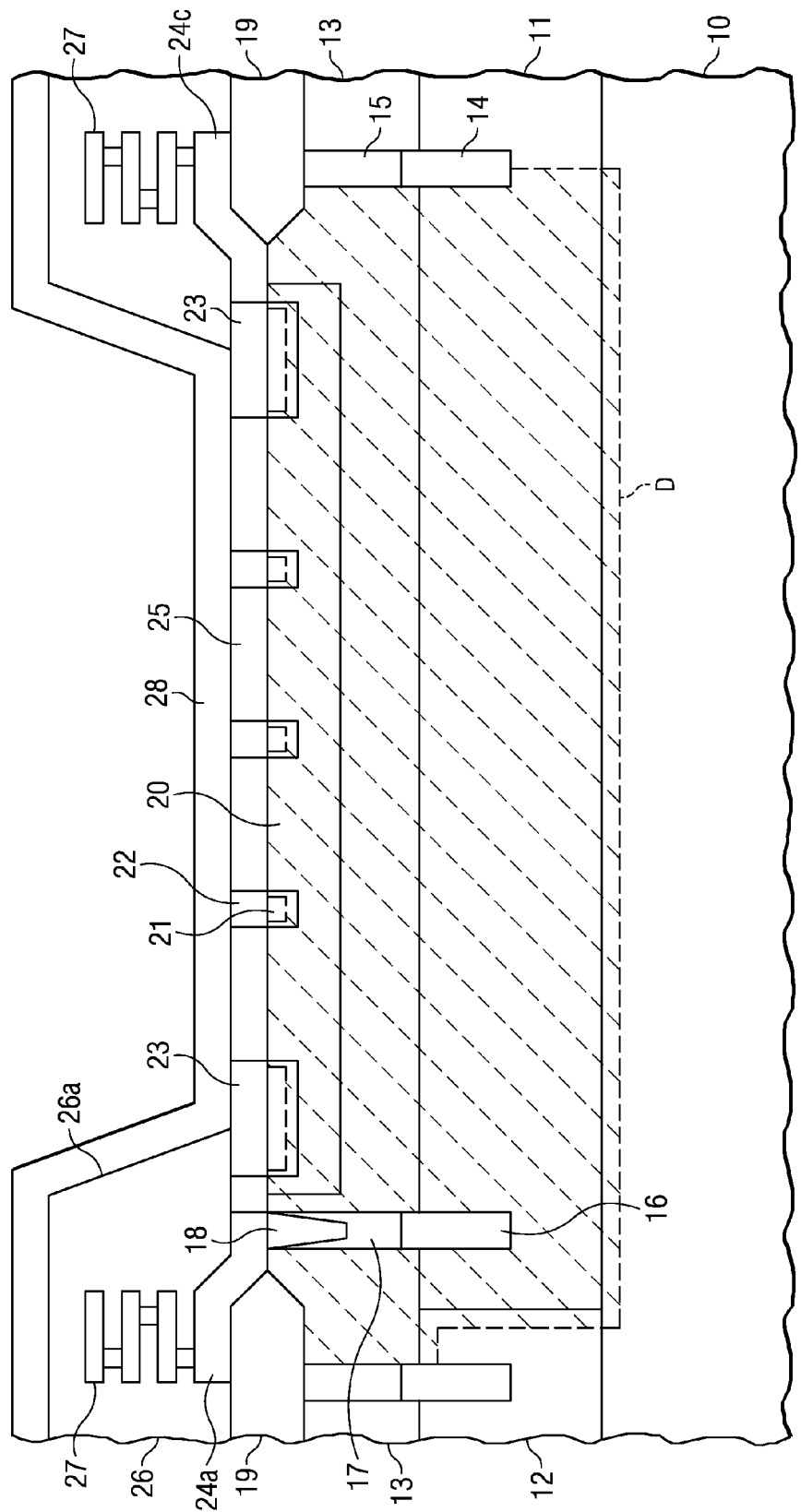
FIG. 8 is a schematic diagram illustrating widening depletion layer D when a prescribed voltage is applied from the anode and cathode to the photodiode disclosed in the second embodiment.

FIG. 8 is a schematic diagram illustrating the widening of depletion layer D when a prescribed voltage is applied from the anode and cathode to the photodiode disclosed in this embodiment.

As in the first embodiment, and as shown in FIG. 8, n⁻ type semiconductor layer (second semiconductor layer) 13 with a low concentration, n type semiconductor layer (third semiconductor layer) 20 with a medium concentration, and n+ type semiconductor layer (fourth semiconductor layer) 21 with a high concentration are laminated to form the n type semiconductor layer that constitutes the pn junction. N+ type semiconductor layer (fourth semiconductor layer) 21 is subdivided by n type semiconductor layer (third semiconductor layer) 20 in one cross section. When a prescribed voltage is applied to semiconductor substrate (first semiconductor layer) 10 and n⁻ type semiconductor layer (second semiconductor layer) 13, the depletion layer can be widened into the area near the surface layer of n type semiconductor layer (third semiconductor layer) 20 that subdivides n+ type semiconductor layer (fourth semiconductor layer) 21. The sensitivity to light with a wavelength in the blue region can be improved.

As in the first embodiment, in the photodiode disclosed in this embodiment, when electron-hole pairs are generated by the photoelectric effect, the electrons with higher mobility than the holes move fast in the n type semiconductor layer and are captured quickly by metal silicide layer 22(E). As a result, the quick re-coupling of the electron-hole pairs can be prevented and controlled, and the photocarrier component detected can be increased. As a result, the sensitivity can be improved.

Also when n⁻ type semiconductor layer (second semiconductor layer) 13 and n type semiconductor layer (third semiconductor layer) 20 are laminated and n+ type semiconductor layer (fourth semiconductor layer) 21 is subdivided by n type semiconductor layer (third semiconductor layer) 20 in one cross section to adjust the impurity profile of the n type semiconductor layer, an increase in the electrical resistance of the n type layer can be inhibited, and deterioration of the high-frequency characteristics can be controlled so that the sensitivity to light with a wavelength in the blue region can be improved while guaranteeing the essential high-frequency characteristics.

Embodiments

A photodiode corresponding to the first embodiment was formed and used as Embodiment Sample 1.

Also, a photodiode corresponding to a second embodiment was formed and used as Embodiment Sample 2.

A photodiode was formed as a conventional sample by laminating n⁻ type semiconductor layer, n type semiconductor layer, and n⁺ semiconductor layer over the entire surface of the light receiving region. No lattice-shaped metal silicide layer was formed for the conventional sample. The area of the light receiving region was the same as for the aforementioned samples.

As the high-frequency characteristics, the conventional sample had a BW value of 300 MHz and a sensitivity of 0.120 A/W. In this case, the BW level of practical value was 200 MHz. Since 300 MHz was over the specification, there was room for lowering the BW value.

For Embodiment Sample 1, the BW value was 240 MHz, which was lower than that of the conventional sample but was still within the practical range. The sensitivity was significantly improved to 0.284 A/W.

For Embodiment Sample 2, the BW value was 270 MHz, which was better than that of Embodiment Sample 1. The sensitivity was 0.269 A/W, which showed the same degree of improvement as Embodiment Sample 1.

The present invention is not limited by the aforementioned explanation.

For example, the metal silicide layer is not limited to PtSi. It is possible to use other metal silicide layers or metal-containing electroconductive layers.

The width of the metal silicide layer and the distance between the metal silicide layers can be varied according to the size of the received light beam. Also, other layouts besides the lattice shape and the pattern of plural straight lines can be adopted.

Besides light with a wavelength of about 405 nm in the blue region, the received light can also be light with a wavelength of 780 nm or of 650 nm in the red region. The present invention is also applicable to light with a wavelength shorter than 400 nm.

Although having the intrinsic semiconductor layer is preferred, it can be omitted in some cases.

Other modifications can also be made as long as they do not deviate from the gist of the present invention.

POSSIBILITY OF INDUSTRIAL APPLICATION

The photodiode of the present invention can be used to constitute optical pickup devices in optical disc devices.

The invention claimed is:

1. A photodiode having:
   a p type first semiconductor layer,
   an n type second semiconductor layer formed directly or via an intrinsic semiconductor layer on said first semiconductor layer and containing an n type electroconductive impurity at a low concentration,
   an n type third semiconductor layer that contains an n type electroconductive impurity at a medium concentration and is formed shallower than said second semiconductor layer in the main plane of the second semiconductor layer in a layout subdivided by said second semiconductor layer in at least one cross section,
   an n type fourth semiconductor layer that contains an n type electroconductive impurity at a high concentration and is formed shallower than said third semiconductor layer in the main plane of the third semiconductor layer in a layout subdivided by said second semiconductor layer in at least one cross section, and
   a metal-containing electroconductive layer formed on said fourth semiconductor layer in the same layout as the fourth semiconductor layer.

2. The photodiode described in claim 1 characterized by the fact that
   when a prescribed voltage is applied to said first semiconductor layer and second semiconductor layer, a depletion layer is formed in the area near the main plane of the second semiconductor layer in the region where said fourth semiconductor layer is subdivided.

3. A photodiode having:
   a p type first semiconductor layer,
   an n type second semiconductor layer formed directly on said first semiconductor layer and containing an n type electroconductive impurity at a low concentration,
   an n type third semiconductor layer that contains an n type electroconductive impurity at a medium concentration and is formed shallower than said second semiconductor layer in the main plane of the second semiconductor layer,
   an n type fourth semiconductor layer that contains an n type electroconductive impurity at a high concentration and is formed shallower than said third semiconductor layer in the main plane of the third semiconductor layer in a layout subdivided by said third semiconductor layer in at least one cross section, and
   a metal-containing electroconductive layer formed on said fourth semiconductor layer in the same layout as the fourth semiconductor layer.

4. The photodiode described in claim 3 characterized by the fact that
   when a prescribed voltage is applied to said first semiconductor layer and second semiconductor layer, a depletion layer is formed in the area near the main plane of the third semiconductor layer in the region where said fourth semiconductor layer is subdivided.

5. The photodiode described in claim 4 characterized by the fact that
   said metal-containing electroconductive layer is a metal silicide layer.

6. The photodiode described in claim 5 characterized by the fact that
   the layout of said fourth semiconductor layer and the metal-containing electroconductive layer is a lattice-shaped pattern.

7. The photodiode described in claim 5 characterized by the fact that
   the layout of said fourth semiconductor layer and the metal-containing electroconductive layer has a pattern of plural straight lines.

8. A photodiode having:
   a first semiconductor layer of a first electroconductivity type, a second semiconductor layer of a second electroconductivity type formed on said first semiconductor layer, a third semiconductor layer of the second electroconductivity type and having a higher impurity concentration than said second semiconductor layer that is formed partially in the main plane of said second semiconductor layer, a metal silicide layer formed on said third semiconductor layer, and a first electrode electrically connected to said metal silicide layer and said third semiconductor layer.

9. The photodiode described in claim 8 characterized by also having an intrinsic layer formed between said first semiconductor layer and second semiconductor layer and a second electrode electrically connected to said intrinsic layer.

10. The photodiode described in claim 8 or 9 characterized by also having a fourth semiconductor layer of the second electroconductivity type, which is formed between the second and third semiconductor layers and has a higher impurity concentration than the second semiconductor layer and a lower impurity concentration than the third semiconductor layer.

11. The photodiode described in claim 9 characterized by also having a fourth semiconductor layer of the second electroconductivity type formed between said intrinsic layer and the second semiconductor layer and having a lower impurity concentration than the second semiconductor layer.

12. The photodiode described in claim 11 characterized by the fact that the third semiconductor layer and the metal silicide layer are formed in a lattice shape.

13. The photodiode described in claim 11 characterized by the fact that the third semiconductor layer and the metal silicide layer are formed in a strip shape.

14. The photodiode described in claim 13 characterized by also having an antireflection film formed on the second semiconductor layer and serving as the silicide blocking layer for said metal silicide layer.

15. The photodiode described in claim 14 characterized by the fact that said first electroconductivity type is p type, while said second electroconductivity type is n type.

16. The photodiode described in claim 15 characterized by the fact that a depletion layer is formed in the main plane part of the second semiconductor layer between the second and third semiconductor layers.

* * * * *